United States Patent [19]

Barbiaux

[11] Patent Number: 4,629,981
[45] Date of Patent: Dec. 16, 1986

[54] METER OVERDRIVE PROTECTION CIRCUIT

[75] Inventor: William J. Barbiaux, Schaumburg, Ill.

[73] Assignee: Motorola, Inc., Schaumburg, Ill.

[21] Appl. No.: 842,380

[22] Filed: Mar. 24, 1986

Related U.S. Application Data

[63] Continuation of Ser. No. 622,026, Jun. 18, 1984, abandoned.

[51] Int. Cl.⁴ .......................... G01P 3/48; G01P 3/54; G01P 23/02
[52] U.S. Cl. .................... 324/166; 324/161; 340/870.02
[58] Field of Search ............... 307/519, 522, 265, 266, 307/267, 271, 234; 361/239, 240, 242; 324/161, 160, 166, 163, 173; 364/565; 340/870.24, 870.02

[56] References Cited

U.S. PATENT DOCUMENTS

| | | | |
|---|---|---|---|
| 3,500,190 | 3/1970 | Michon | 361/239 |
| 3,737,773 | 6/1973 | Zobel | 324/173 |
| 4,085,373 | 4/1978 | McConnell | 307/519 |

OTHER PUBLICATIONS

Long: LM2907 Application Note—(AN-162); National Semi. Jun. 1976—16 pages.

Primary Examiner—Reinhard J. Eisenzopf
Assistant Examiner—Jose M. Solis
Attorney, Agent, or Firm—Steven G. Parmelee

[57] ABSTRACT

A meter overdrive protection circuit is provided using a variable duty cycle drive pulse. Such meters usually comprise speedometers and tachometers used in highway vehicles such as trucks. A programmable pulse generator is utilized to provide a series of pulses of a selected width depending on the truck model. A sensor input corresponding to the rate of rotation of the drive shaft of the truck is used to trigger the pulse generator to produce each output pulse. Such output pulses are supplied to a meter drive which, based on the time average value of the output pulses received, displays an output value related to the rate of rotation of the truck drive shaft. Upon the triggering inputs exceeding a preselected frequency, a microcomputer will change the pulse generator operation to a fixed duty cycle operation whereupon the meter will be held to a full scale deflection. When the triggering inputs decrease below the preselected frequency, the pulse generator will be returned to a triggering output mode. Such meter drive circuit protects electromagnetic meter needle movement from damage due to full scale pinning against a mechanical stop.

1 Claim, 3 Drawing Figures

METER OVERDRIVE PROTECTION CIRCUIT

This is a continuation of application Ser. No. 622,026, filed June 18, 1984, now abandoned.

BACKGROUND OF THE INVENTION

The present invention relates to a meter overdrive protection circuit, and more particularly, to a programmable meter drive circuit having an overdrive protection scheme.

In developing a speedometer or tachometer for a highway vehicle such as a truck, it is desirable to utilize a programmable pulse source as a meter drive. Differences in tire size and gear ratios for the particular truck models can be programmed into the pulse source such that a particular width pulse is utilized for a particular truck. The width of the pulse is related to revolutions of the transmission shaft in the case of a speedometer or revolutions of the drive shaft in the case of a tachometer. A microcomputer is usually utilized to program the pulse generator to produce pulses of a width necessary to provide proper meter deflection. The programmable pulse generator usually comprises an integrated circuit chip having a pulse generation mode. The output pulses from the pulse generator are utilized to drive the meter. The meter drive typically comprises an electromechanical meter movement which performs a time averaging of the pulses received from the pulse generator and produces a corresponding deflection in the meter needle.

The pulse generator is dependent on a trigger signal received from and generated by a reluctance sensor coil positioned with a rotating gear on the appropriate rotating shaft of the vehicle. In a tachometer application, such gear is usually the fly-wheel, and in a speedometer application, such shaft is usually the transmission output drive shaft. The rotating device contains teeth which induce a current in the reluctance coil sensor. Such current is of a sinusoidal nature, and this current is input to the pulse generator to typically cause the triggering of the pulse generator upon receipt of a positive waveform from the sensor.

In the event of an overspeed condition of the rotating device, an excessive number of trigger signals will be received by the pulse generator. The width of the pulse generator output waves will not change, but rather the frequency of such output waves will increase due to the increased frequeny of trigger signals. Accordingly, the meter deflection will increase and correctly reflect the increased rate of rotation of the shaft being measured. However, if the frequency of such triggering signals exceeds a certain rate, the time average value of the pulse generator output would exceed the preselected value required for full scale meter deflection and cause the needle to be pinned against a mechanical stop. It is an object of the present invention to provide a scheme of avoiding the mechanical pinning and possible damage to the meter needle.

Another problem which could occur in the event of an overspeed operation of the rotating device is that the triggering signals from the sensor device could increase in frequency to a point such that, due to the width of the pulse generator output pulses, a triggering signal could be received during a pulse generator on condition. Such a triggering signal would be ignored since the pulse generator was already in an on condition, and accordingly an incorrect reading of the rotation rate of the shaft would be reflected in the meter device. Accordingly, it is another object of the present invention to provide a method of avoiding such incorrect meter indication of an overspeed condition.

SUMMARY OF THE INVENTION

The present invention provides a programmable meter drive circuit having a meter overdrive protection scheme. Such meters are typically speedometers or tachometers in highway vehicles such as trucks. In the case of a speedometer, the particular vehicle tire size and gear ratio effect the speedometer reading. Accordingly, a microcomputer is programmed to identify the particular vehicle model and in turn to program a pulse generator to produce pulses of a width necessary to provide proper meter deflection. The programmable pulse generator usually comprises an integrated circuit chip having a pulse generation mode. The pulse generator output is a series of square waves the width of each of which is dependent on the vehicle model. The pulse generator is triggered to produce such an output wave upon receipt of a triggering pulse from a sensor circuit. The sensor circuit is typically a reluctance coil positioned with a rotating gear on the appropriate rotating shaft of the vehicle. The rotating device contains teeth which induce a current in the reluctance coil. Such current is of a sinusoidal nature, and this current is input to the pulse generator to typically cause the triggering of the pulse generator upon receipt of a positive wave form from the sensor. The output pulses from the pulse generator are utilized to drive a meter usually comprising an electromagnetic needle movement. Such meter drive performs a time averaging of the pulses received from the pulse generator and produces a corresponding deflection in the meter.

As the rate of rotation of the shaft on which the sensor device is located increases, the triggering signals from the sensor device will increase in frequency. Such triggering signals can be thought of as spike pulses. Because the width of the pulse generator output waves does not change once the particular vehicle model is identified to the microcomputer, the frequency of the output waves increases with the increased frequency of the triggering signals from the sensor device. Accordingly, the meter deflection increases to correctly reflect the increased rate of rotation of the shaft being measured.

One problem which can occur upon the rate of rotation of the shaft increasing beyond a preselected maximum value is that the meter needle will be deflected to a maximum point usually encountering a mechanical stop. This is undesirable as such pinning of the needle against a mechanical stop can damage the meter movement and introduce error into future readings. Another problem which can occur upon the increasing of the triggering signals from the sensor circuit beyond a preselected frequency is that a triggering signal could be received by the pulse generator while the pulse generator is in an on or pulse generating condition. It is the nature of such pulse generator circuits to ignore such trigger pulse and continue through the normal width of the pulse being generated. Accordingly, the trigger pulse will be ignored and the next or following trigger pulse will be required to initiate an output pulse from the pulse generator. Accordingly, a fold back condition is developed wherein the pulse generator ignores every other or alternating trigger signals and accordingly provides fewer than the required output pulses to properly drive the meter to reflect the proper rate of rotation of the shaft being measured. In effect, the period of the trigger pulses has become shorter than the pulse generator output width.

The meter overdrive protection circuit of the present invention solves these problems. The microcomputer is utilized to operate the pulse generator in two modes. The microcomputer receives an output from the sensor circuit whereupon it is aware of the frequency of the trigger pulses. As the microcomputer has also preselected the pulse width of the output pulses to be supplied by the pulse generator it is able to compare the pulse width with the period of the trigger input. The computer, pulse generator and meter drive circuit are selected such that a 90% (or other preselected value) on cycle condition of the pulse generator will provide a full scale meter deflection. The meter is so designed that a mechanical stop is provided for a two or three percent above full scale needle deflection. The circuitry of the present invention is designed to permit a maximum of 100% full scale deflection. When the microcomputer senses that the triggering inputs have required the pulse generator to provide on pulses for 90% of the time period, the computer will change the mode of the pulse generator operation from a normal or triggered pulse mode to a constant duty cycle mode. In such constant duty cycle mode, the pulse generator will provide a series of pulses to the meter drive corresponding to a 90% on duty cycle. Further, the computer will instruct the pulse generator to ignore triggering pulse inputs from the sensor circuit. Accordingly, if the rate of rotation increases beyond such preselected 90% and an increased number of triggering pulses is output by the sensor circuit to the pulse generator, the pulse generator remains in the constant duty cycle mode. Accordingly, the meter remains at 100% full scale deflection, without contacting the mechanical stop which is at 102 or 103% of full scale deflection. Further, the pulse generator cannot miss every other or alternating trigger signals from the sensor circuit and accordingly, incorrectly provide only one-half the necessary output to the meter drive, as the pulse generator is ignoring the sensor circuit output. Upon a decrease in the rotation of the shaft being measured, the sensor circuit will provide a frequency of trigger signals less than the frequency of trigger signals required to provide full scale meter deflection, and the computer will sense such decreased trigger signal frequency. The computer will return the pulse generator to a normal or triggered pulse mode whereupon the meter can correctly reflect the decreasing number of revolutions of the measured shaft.

In particular, the present invention provides a meter drive circuit comprising circuit means adapted to produce an output signal having a frequency related to the rate of rotation of a shaft, a sensor circuit receiving the output signal from said circuit means and providing trigger pulses related to the rate of shaft rotation, a computer means receiving the trigger pulses from said sensor circuit, a pulse generator also receiving the trigger pulses from said sensor circuit and providing a meter drive pulse of a selected width upon the receipt of each trigger pulse, a meter circuit receiving said series of meter drive pulses from said pulse generator, said computer means providing an output signal to said pulse generator whereby the width of the meter drive pulses is established, said computer means also adapted to analyze the frequency of trigger pulses from said sensor circuit, and if the time interval between said trigger pulses is less than a predetermined time interval, said computer means will provide a signal to said pulse generator whereby said pulse generator will ignore the trigger pulses from the sensor circuit and provide meter drive pulses at a preselected frequency and pulse length. The present invention also provides a meter drive circuit comprising a source of trigger pulses having a frequency related to the rate of rotation of a shaft, a computer receiving said trigger pulses, a pulse generator receiving said trigger pulses and receiving an output from said computer, said computer output to said pulse generator adjusting the width of the drive pulses to be output by said pulse generator to correspond to certain parameters of said rotating shaft, the frequency of said drive pulses being related to the frequency of said trigger pulses, upon the frequency of said trigger pulses exceeding a predetermined value, said computer sensing such condition and outputting a signal to said pulse generator such that said pulse generator output drive pulses are provided at a predetermined frequency independent of said trigger pulses, and a meter circuit receiving the output drive pulses from said pulse generator.

DESCRIPTION OF THE PREFERRED EMBODIMENT

Figure 1:
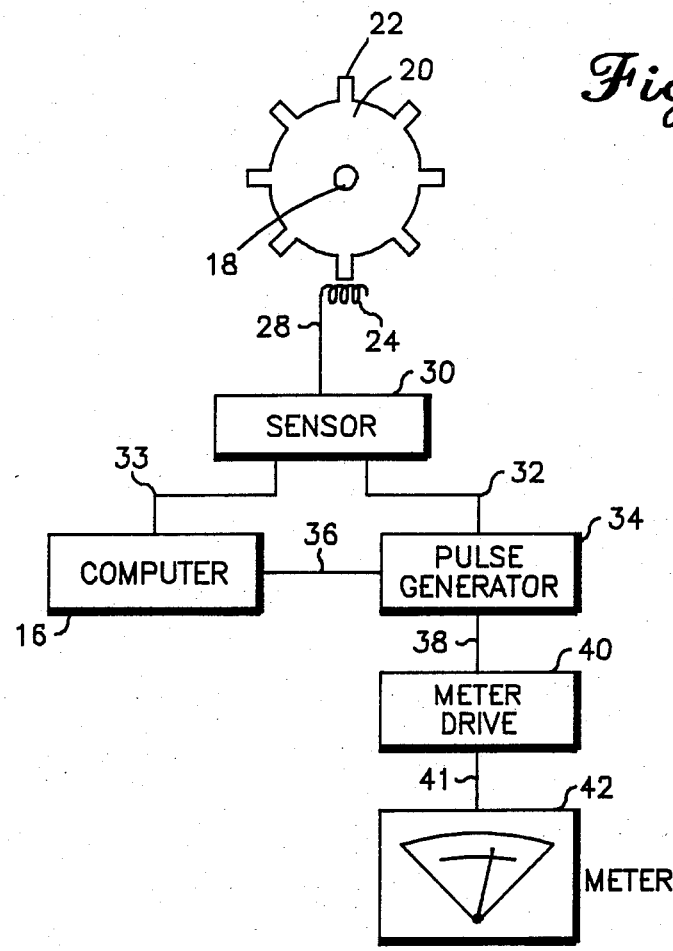
FIG. 1 is a schematic diagram of a meter overdrive protection circuit in accordance with the present invention.

Referring now to FIG. 1, a meter overdrive protection circuit in accordance with the present invention is shown. A rotating shaft is shown at 18 surrounded by a wheel 20 having protruding teeth 22. When the meter drive of the present invention is being utilized in a tachometer circuit, wheel 20 will correspond to the flywheel of the vehicle engine whose revolutions are to be metered by the tachometer. If the meter drive circuit of the present invention were being utilized in a speedometer, drive shaft 18 would correspond to the output shaft of the vehicle transmission. As wheel 20 is rotated by shaft 18, protruding gear teeth 22 would induce a current in magnetic coil 24. This current would be of a sinusoidal nature and would be output over line 28 to sensor circuit 30. Sensor circuit 30 comprises a well known trigger circuit, which would provide a spike-like output pulse over line 32 corresponding with the positive sinewave input from coil 24. A computer 16 usually comprising a microcomputer having modest storage and retrieval capabilities also receives an output from sensor circuit 30 over line 33. A pulse generator circuit 34 usually comprising a programmable integrated circuit chip receives a programming input 36 from computer 16. Pulse generator 34 also receives a triggering input from sensor 30 via input line 32. The input from computer 16 over line 36 to pulse generator 34 comprises serial binary coded data from the computer and is placed in internal registers within the pulse generator 34. Since pulse generator 34 is typically a standard integrated circuit capable of multiple functions, pulse generator 34 will also store information from computer 16 telling it to operate in a pulse generating mode. The programming input from computer 16 instructs pulse generator 34 to produce a pulse of a selected width which is output whenever the pulse generator receives a triggering input from sensor 30. The width of such output pulse supplied to meter drive 40 is dependent upon the vehicle characteristics for which computer 16 has been programmed. Once such vehicle characteristics are entered in computer 16, the width of output pulses from pulse generator 34 becomes fixed. Such fixed length pulses will be output by pulse generator 34 upon receipt of each triggering input from sensor 30 as long as the pulse generator 34 is instructed by computer 16 to operate in the pulse generating mode.

Figure 2:
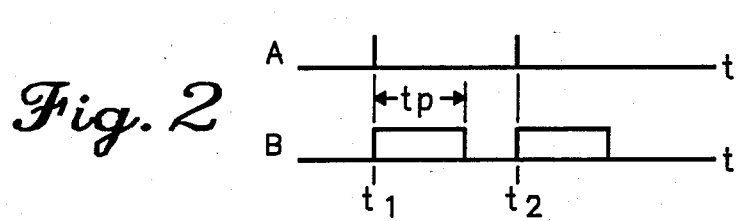
FIG. 2 is a diagram of trigger pulses at A and output pulses from the pulse generator at B showing a normal mode of operation of the present invention.
Figure 3:
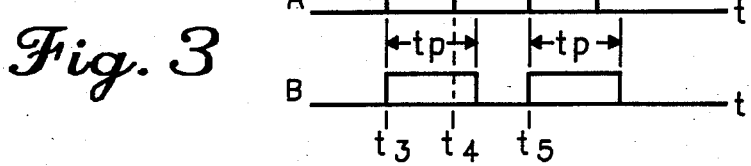
FIG. 3 is a diagram of trigger pulses at A and output pulses from a pulse generator at B in an overspeed condition wherein the meter overdrive circuit of the present invention is not utilized.

Meter drive 40 receives such output pulses from pulse generator 34 over input line 38. Meter drive circuit 40 typically comprises a transistor which is triggered by output pulses from pulse generator 34. Referring to FIG. 2, once the particular vehicle characteristics are input to the computer, the width of output pulses from pulse generator 34 is set. Output from meter drive 40 is via line 41 to meter 42. Typically meter 42 is of a deflecting needle or electromagnetic type. While the width of pulses from pulse generator 34 is fixed, once the vehicle characteristics are entered in the computer, the frequency of such pulses is dependent upon the frequency of triggering inputs from sensor 30. In FIG. 2, waveform A indicates triggering inputs from sensor 30, and waveform B indicates corresponding meter drive pulses from pulse generator 34. As trigger inputs occur at times $t_1$ and $t_2$, output pulses of preselected width $t_p$ are generated by pulse generator 34. Referring now to FIG. 3, an increased rate of rotation of shaft 18 is shown resulting in an increased frequency of trigger pulses from sensor 30 shown at waveform A. Waveform B shows the resulting outputs from pulse generator 34. As the first triggering input occurs at time $t_3$, a pulse generator 34 output wave of wave length $t_p$ would be initiated at such time $t_3$. However, the length (or, interchangably for the present explanation, width) of pulse generator 34 output pulse $t_p$ exceeds the period or time between trigger pulses shown in waveform A as the next trigger pulses occurs at time $t_4$. Accordingly, pulse generator 34 would ignore such trigger input at time $t_4$ and continue its output for time $t_p$. The next triggering input from sensor 30 occurs at time $t_5$ whereupon pulse generator 34 would again initiate an output pulse of length $t_p$. It is easily seen from FIG. 3 how pulse generator 34 could provide an incorrect indication of the increased rate of rotation of shaft 18. This is what is known as a fold back condition where in effect meter 42 would show less than the correct rate of rotation of shaft 18.

By having computer 16 change the mode of operation of pulse generator 34 from a normal or triggered pulse generation mode to a fixed duty cycle mode, the overdriving of the meter needle and the possible fold back incorrect indication of the rate of rotation are both eliminated. Referring to FIG. 2, as the on duty cycle time of waveform B approaches 90% (or other preselected maximum desired value) of the total time, computer 16 would be programmed to sense such condition by measuring the time between the trigger pulses $t_1$ and $t_2$. As the time interval between trigger pulses equals about 1.1 times the selected wave length $t_p$ of the meter drive pulses from pulse generator 34, the computer will change the mode of operation of pulse generator 34 from a normal or triggered pulse output to a fixed duty cycle output. Another way of stating this is that the computer will sense from the pulse generator when the preselected frequency and pulse length of outputs from pulse generator 34 are such that output drive pulses are being provided for 90% (or other preselected maximum desired values) of the time, and then the computer will instruct pulse generator 34 to operate in a fixed duty cycle mode rather than a normal or triggered pulse mode.

I claim:
1. A meter drive circuit for use with:
a meter having a needle; and
a source of pulses, each of said pulses corresponding to rotation of a shaft located in a particular operating environment, said meter drive circuit comprising:
(A) a pulse generator having at least one internal register for storing binary coded data and further having a programming input, a triggering input operably connected to receive said pulses from said source of pulses, and an output, said pulse generator being selectively operable in either of at least two operating modes, wherein:
  (i) one of said operating modes comprises a pulse generating mode that provides a meter drive pulse having a fixed width at said output upon receipt of a pulse at said triggering input, said fixed width being determined, at least in part, by said binary coded data; and
  (ii) another of said operating modes comprises a fixed duty cycle mode that provides a signal at said output having a fixed duty cycle regardless of what signals are received at said triggering input;
(B) a microcomputer having modest storage and retrieval capabilities, said microcomputer having:
  (i) an input connected to receive a signal related to said pulses from said source of pulses; and
  (ii) an output operably connected to said programming input of said pulse generator:
    (a) for allowing said microcomputer to store said binary coded data in said internal register of said pulse generator; and
    (b) for allowing said microcomputer to control the operating mode said pulse generator;
  wherein said microcomputer provides binary coded data relating to said particular operating environment to said pulse generator to thereby calibrate said pulse generator, and wherein said microcomputer monitors said input from said source of pulses and causes said pulse generator to operate in said fixed duty cycle mode when said signal as supplied to said input to said microcomputer at least equals a preselected frequency; and
(C) a meter drive that receives the output of said pulse generator and that causes said needle of said meter to deflect in response thereto.

* * * * *